(12) United States Patent
De Graaf et al.

(10) Patent No.: US 9,405,205 B2
(45) Date of Patent: *Aug. 2, 2016

(54) LITHOGRAPHIC APPARATUS AND IN-LINE CLEANING APPARATUS

(71) Applicant: ASML Netherlands B.V., Veldhoven (NL)

(72) Inventors: Roelof Frederik De Graaf, Veldhoven (NL); Hans Jansen, Eindhoven (NL); Bauke Jansen, Deurne (NL); Hubertus Leonardus Franciscus Heusschen, Eindhoven (NL)

(73) Assignee: ASML NETHERLANDS B.V., Veldhoven (NL)

( * ) Notice: Subject to any disclaimer, the term of this patent is extended or adjusted under 35 U.S.C. 154(b) by 0 days.

This patent is subject to a terminal disclaimer.

(21) Appl. No.: 14/714,944

(22) Filed: May 18, 2015

(65) Prior Publication Data

US 2015/0323875 A1 Nov. 12, 2015

Related U.S. Application Data

(60) Continuation of application No. 13/549,037, filed on Jul. 13, 2012, now Pat. No. 9,036,128, which is a division of application No. 12/318,037, filed on Dec. 19, 2008, now Pat. No. 8,243,255.

(60) Provisional application No. 61/008,299, filed on Dec. 20, 2007.

(51) Int. Cl.
G03B 27/52 (2006.01)
G03B 27/42 (2006.01)
G03F 7/20 (2006.01)

(52) U.S. Cl.
CPC ........ *G03F 7/70925* (2013.01); *G03F 7/70341* (2013.01)

(58) Field of Classification Search
CPC .................................................. G03F 7/70341
USPC ........................................................ 355/30, 53
See application file for complete search history.

(56) References Cited

U.S. PATENT DOCUMENTS

| 4,509,852 A | 4/1985 | Tabarelli et al. |
| 6,496,257 B1 | 12/2002 | Taniguchi et al. |

(Continued)

FOREIGN PATENT DOCUMENTS

| CN | 1963673 | 5/2007 |
| EP | 1 420 300 A2 | 5/2004 |

(Continued)

OTHER PUBLICATIONS

English translation of Japanese Office Action for Japanese Patent Application No. 2008-318283, mailed on Jun. 8, 2011.

*Primary Examiner* — Hung Henry Nguyen
(74) *Attorney, Agent, or Firm* — Pillsbury Winthrop Shaw Pittman LLP

(57) ABSTRACT

A lithographic system includes an immersion type lithographic apparatus, which includes a support constructed and arranged to support a substrate, a projection system constructed and arranged to project a patterned beam of radiation onto a target portion of the substrate, a liquid confinement structure configured to at least partially fill a space between the projection system and at least one of the substrate and support with an immersion liquid, a liquid supply system arranged to provide the immersion liquid to the liquid confinement structure, and a cleaning liquid supply system arranged to provide a cleaning liquid to a surface of the lithographic apparatus that comes into contact with the immersion liquid. The system includes a switch to provide the cleaning liquid directly to the liquid confinement structure and to provide the immersion liquid indirectly to the liquid confinement structure via a liquid purification system.

22 Claims, 8 Drawing Sheets

(56) References Cited

U.S. PATENT DOCUMENTS

| | | | |
|---|---|---|---|
| 7,050,146 B2 | 5/2006 | Duineveld et al. |
| 7,091,502 B2 | 8/2006 | Gau et al. |
| 7,224,427 B2 | 5/2007 | Chang et al. |
| 7,224,434 B2 | 5/2007 | Tokita |
| 7,262,422 B2 | 8/2007 | Subramanian et al. |
| 7,307,263 B2 | 12/2007 | Bakker et al. |
| 7,315,033 B1 | 1/2008 | Pawloski et al. |
| 7,385,670 B2 | 6/2008 | Compen et al. |
| 7,405,417 B2 | 7/2008 | Stevens et al. |
| 7,462,850 B2 | 12/2008 | Banine et al. |
| 7,481,867 B2 * | 1/2009 | Harpham ............ G03F 7/70841 95/175 |
| 7,522,259 B2 | 4/2009 | Hazelton et al. |
| 8,004,651 B2 | 8/2011 | Nagasaka |
| RE42,849 E | 10/2011 | Duineveld et al. |
| 8,243,255 B2 * | 8/2012 | De Graaf ............ G03F 7/70925 355/30 |
| 8,269,946 B2 | 9/2012 | Kawai |
| 8,817,226 B2 | 8/2014 | Sewell et al. |
| 2004/0136494 A1 | 7/2004 | Lof et al. |
| 2004/0207824 A1 | 10/2004 | Lof et al. |
| 2005/0024609 A1 | 2/2005 | De Smit et al. |
| 2005/0175776 A1 | 8/2005 | Streefkerk et al. |
| 2005/0264774 A1 | 12/2005 | Mizutani et al. |
| 2005/0274898 A1 | 12/2005 | Watanabe et al. |
| 2006/0023185 A1 | 2/2006 | Hazelton et al. |
| 2006/0038968 A1 | 2/2006 | Kemper et al. |
| 2006/0050351 A1 | 3/2006 | Higashiki |
| 2006/0103818 A1 | 5/2006 | Holmes et al. |
| 2006/0132731 A1 | 6/2006 | Jansen et al. |
| 2006/0158627 A1 | 7/2006 | Kemper et al. |
| 2006/0232757 A1 | 10/2006 | Tani et al. |
| 2006/0250588 A1 | 11/2006 | Brandl |
| 2006/0256316 A1 | 11/2006 | Tanno et al. |
| 2007/0002296 A1 | 1/2007 | Chang et al. |
| 2007/0026345 A1 | 2/2007 | Subramanian et al. |
| 2007/0064215 A1 | 3/2007 | Dirksen et al. |
| 2007/0076197 A1 | 4/2007 | Koga |
| 2007/0085989 A1 | 4/2007 | Nagahashi et al. |
| 2007/0091287 A1 | 4/2007 | Chang et al. |
| 2007/0127001 A1 | 6/2007 | Van Der Hoeven |
| 2007/0146657 A1 | 6/2007 | Van Mierlo et al. |
| 2007/0146658 A1 | 6/2007 | Van Mierlo et al. |
| 2007/0159610 A1 | 7/2007 | Shiraishi |
| 2007/0172234 A1 | 7/2007 | Shigemori et al. |
| 2007/0206279 A1 | 9/2007 | Brueck et al. |
| 2007/0229789 A1 | 10/2007 | Kawamura |
| 2007/0247600 A1 | 10/2007 | Kobayashi et al. |
| 2007/0251543 A1 | 11/2007 | Singh |
| 2007/0253710 A1 | 11/2007 | Kaneyama et al. |
| 2007/0258072 A1 | 11/2007 | Nagasaka et al. |
| 2007/0268466 A1 | 11/2007 | Leenders et al. |
| 2007/0274711 A1 | 11/2007 | Kaneyama et al. |
| 2007/0285631 A1 | 12/2007 | Stavenga et al. |
| 2008/0002162 A1 | 1/2008 | Jansen et al. |
| 2008/0049201 A1 | 2/2008 | Stavenga et al. |
| 2008/0129970 A1 | 6/2008 | Furukawa et al. |
| 2008/0156356 A1 * | 7/2008 | Nagasaka ............ G03F 7/70341 134/115 R |
| 2008/0218712 A1 | 9/2008 | Compen et al. |
| 2008/0273181 A1 | 11/2008 | De Jong et al. |
| 2008/0284990 A1 | 11/2008 | De Jong et al. |
| 2009/0025753 A1 | 1/2009 | De Jong et al. |
| 2009/0027635 A1 | 1/2009 | De Jong et al. |
| 2009/0027636 A1 | 1/2009 | Leenders et al. |
| 2009/0086175 A1 | 4/2009 | Streefkerk et al. |
| 2009/0091716 A1 | 4/2009 | Kadijk et al. |
| 2009/0174870 A1 | 7/2009 | De Jong et al. |
| 2009/0174871 A1 | 7/2009 | De Jong et al. |
| 2009/0190105 A1 | 7/2009 | De Jong |

FOREIGN PATENT DOCUMENTS

| | | |
|---|---|---|
| EP | 1 628 163 A2 | 2/2006 |
| JP | 2000-323396 | 11/2000 |
| JP | 2005-072404 | 3/2005 |
| JP | 2005-079222 | 3/2005 |
| JP | 2006-134999 | 5/2006 |
| JP | 2006-148093 A | 6/2006 |
| JP | 2006-310706 | 11/2006 |
| JP | 2007-029973 | 2/2007 |
| JP | 2007-088328 | 4/2007 |
| JP | 2007-123882 A | 5/2007 |
| JP | 2007-142217 | 6/2007 |
| JP | 2007-150102 | 6/2007 |
| JP | 2007-227543 | 9/2007 |
| JP | 2007-227580 | 9/2007 |
| JP | 2009-500828 A | 1/2009 |
| WO | WO 99/49504 A1 | 9/1999 |
| WO | WO 2005/122218 | 12/2005 |
| WO | WO 2006/041086 | 4/2006 |
| WO | WO 2006/062065 | 6/2006 |
| WO | WO 2006/122578 | 11/2006 |
| WO | 2007/005362 A2 | 1/2007 |
| WO | WO 2007/006447 | 1/2007 |
| WO | WO 2007/135990 | 11/2007 |
| WO | WO 2007/136089 | 11/2007 |
| WO | WO 2008/001871 | 1/2008 |

* cited by examiner

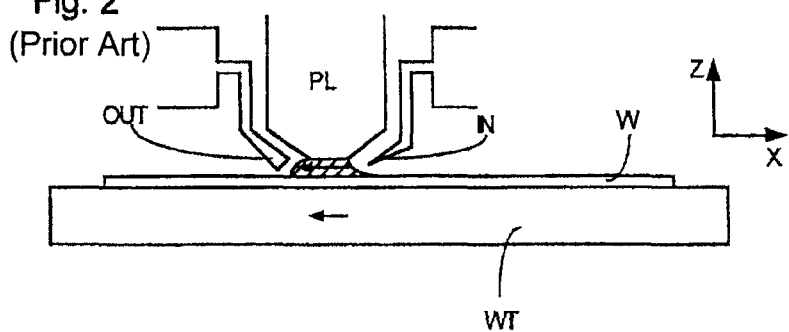
Fig. 2 (Prior Art)
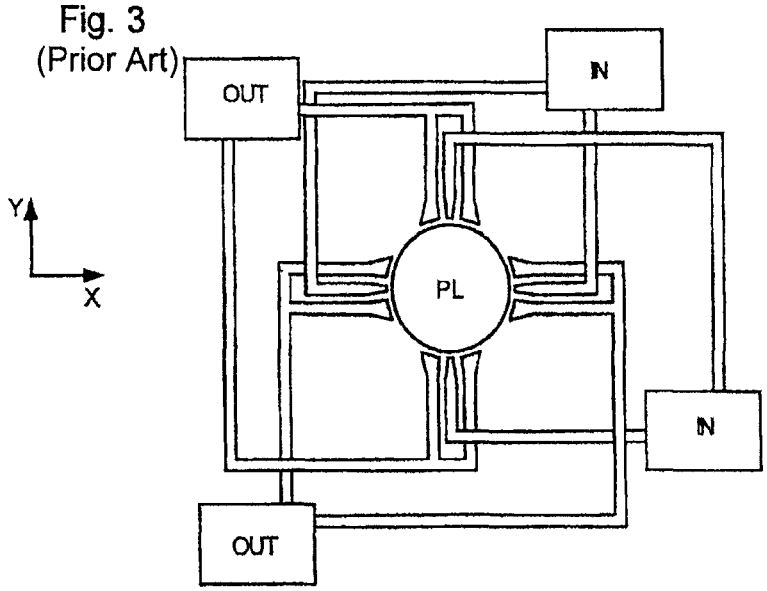
Fig. 3 (Prior Art)
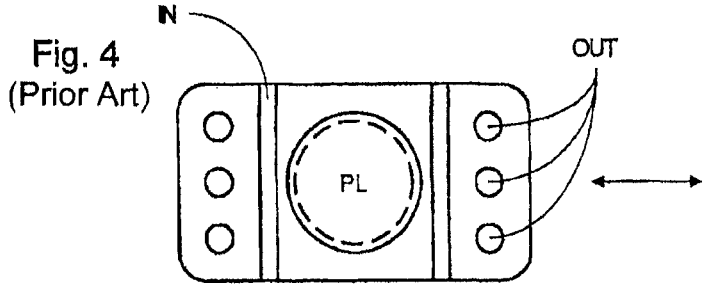
Fig. 4 (Prior Art)
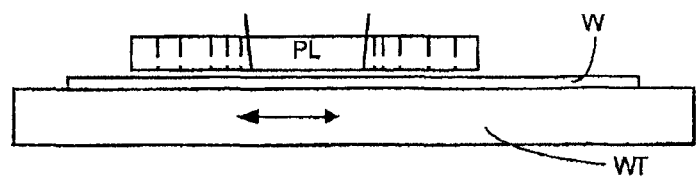

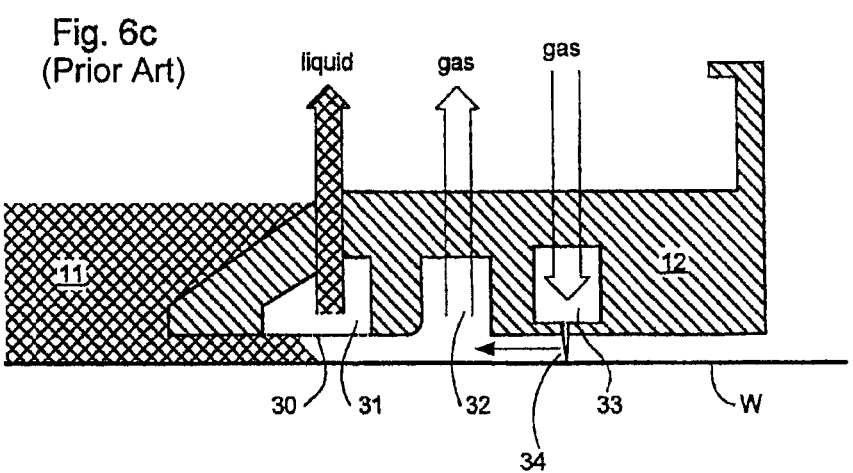

LITHOGRAPHIC APPARATUS AND IN-LINE CLEANING APPARATUS

CROSS-REFERENCE TO RELATED APPLICATIONS

This application is a continuation application of U.S. patent application Ser. No. 13/549,037, filed on Jul. 13, 2012 and issued on May 19, 2015 as U.S. Pat. No. 9,036,128, which is a divisional application of U.S. patent application Ser. No. 12/318,037, filed on Dec. 19, 2008 and issued on Aug. 14, 2012 as U.S. Pat. No. 8,243,255, which claims the benefit of priority from U.S. Provisional Patent Application Ser. No. 61/008,299, filed on Dec. 20, 2007, the contents of all of which are incorporated herein by reference in their entireties.

FIELD

The present invention relates to a lithographic apparatus and a method for removing or preventing contamination in a lithographic apparatus.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

It has been proposed to immerse the substrate in the lithographic projection apparatus in a liquid having a relatively high refractive index, e.g. water, so as to fill a space between the final element of the projection system and the substrate. The liquid is desirably distilled water, although another liquid may be used. An embodiment of the present invention will be described with reference to liquid. However, another fluid may be suitable, particularly a wetting fluid, an incompressible fluid and/or a fluid with a higher refractive index than air, desirably a higher refractive index than water, such as a hydrocarbon, such as a hydrofluorocarbon. The point of this is to enable imaging of smaller features since the exposure radiation will have a shorter wavelength in the liquid. (The effect of the liquid may also be regarded as increasing the effective numerical aperture (NA) of the system and also increasing the depth of focus.) Other immersion liquids have been proposed, including water with solid particles (e.g. quartz) suspended therein. The particles may be of the size of nanoparticles, and may be provided in a concentration that increases the refractive index of the liquid in which they are suspended.

However, submersing the substrate or substrate and substrate table in a bath of liquid (see, for example, U.S. Pat. No. 4,509,852, hereby incorporated in its entirety by reference) means that there is a large body of liquid that must be accelerated during a scanning exposure. This requires additional or more powerful motors and turbulence in the liquid may lead to undesirable and unpredictable effects.

One of the solutions proposed is for a liquid supply system to provide liquid on only a localized area of the substrate and in between the final element of the projection system and the substrate using a liquid confinement system (the substrate generally has a larger surface area than the final element of the projection system). One way which has been proposed to arrange for this is disclosed in PCT patent application publication no. WO 99/49504, hereby incorporated in its entirety by reference. As illustrated in FIGS. 2 and 3, liquid is supplied by at least one inlet IN onto the substrate, preferably along the direction of movement of the substrate relative to the final element, and is removed by at least one outlet OUT after having passed under the projection system. That is, as the substrate is scanned beneath the element in a −X direction, liquid is supplied at the +X side of the element and taken up at the −X side. FIG. 2 shows the arrangement schematically in which liquid is supplied via inlet IN and is taken up on the other side of the element by outlet OUT which is connected to a low pressure source. In the illustration of FIG. 2 the liquid is supplied along the direction of movement of the substrate relative to the final element, though this does not need to be the case. Various orientations and numbers of in- and out-lets positioned around the final element are possible, one example is illustrated in FIG. 3 in which four sets of an inlet with an outlet on either side are provided in a regular pattern around the final element.

There is a need to address the issue of contamination in a lithographic apparatus, such as the contamination generated by removal of particles of top-coat material, resist or both. There are different types of contamination and the degree to which the lithographic apparatus should be cleaned and the type of cleaner that should be used may depend on the type of contamination that is present. Current cleaning methods generally do not allow for in-line cleaning, and accordingly their completion may cause significant down-time of the apparatus.

SUMMARY

According to an embodiment of the invention, there is provided an immersion type lithographic apparatus that includes an immersion system configured to at least partially fill an immersion space with an immersion liquid. The apparatus also includes an indicator configured to indicate whether a part of the lithographic apparatus should be cleaned, and a cleaning liquid supply system configured to supply a cleaning liquid that includes a cleaner to the part of the lithographic apparatus. The cleaner is at least one of a plurality of different cleaners. The or each cleaner or combination of cleaners is configured to clean a different type and/or level of contamination in the part of the lithographic apparatus. The apparatus also includes a controller configured to control which of the plurality of cleaners is provided to the part of the lithographic apparatus, based on an indication received from the indicator.

According to an embodiment of the invention, there is provided an in-line cleaning cabinet for an immersion type lithographic apparatus. The in-line cleaning cabinet includes a fluid outlet constructed and arranged to provide a cleaning fluid to the immersion type lithographic apparatus. The cabinet also includes a plurality of cleaner supply devices that are in fluid communication with the fluid outlet. Each of the cleaner supply devices is constructed and arranged to supply a cleaner to the fluid outlet. The cabinet also includes a controller configured to control the plurality of cleaner supply devices based on a level and/or type of contamination within the immersion type lithographic apparatus so that the cleaning fluid includes at least one of the cleaners.

According to an embodiment of the invention, there is provided a method of cleaning an immersion type lithographic apparatus. The method includes sensing contamination within the immersion type lithographic apparatus. The method also includes selecting a cleaning mode from a plurality of cleaning modes in response to the sensing. The method further includes providing a cleaner from a cleaning system to the contaminated part of the immersion type lithographic apparatus based on the selected cleaning mode.

According to an embodiment of the invention, there is provided a method for supplying a cleaning fluid from an in-line cleaning cabinet to an immersion type lithographic apparatus. The method includes supplying a first cleaner to the in-line cleaning cabinet, and supplying a second cleaner to the in-line cleaning cabinet, and detecting an amount and/or type of contamination within the immersion type lithographic apparatus. The method also includes determining a ratio of the first cleaner and the second cleaner to mix with a fluid carrier based on the detecting, and supplying a mixture of the fluid carrier and the first cleaner and/or the second cleaner to the immersion type lithographic apparatus.

According to an embodiment of the invention, there is provided an immersion type lithographic system. The system includes an immersion type lithographic apparatus, a liquid supply system, and a cleaning system. The lithographic apparatus includes a support constructed and arranged to support a substrate, and a projection system constructed and arranged to project a patterned beam of radiation onto a target portion of the substrate. The lithographic apparatus also includes a liquid confinement structure configured to at least partially fill a space between the projection system and the substrate and/or support with a liquid. The liquid supply system is constructed and arranged to supply the liquid to the liquid confinement structure. The cleaning system is constructed and arranged to supply at least one cleaner to the immersion type lithographic apparatus. The cleaning system is in fluid communication with the liquid supply system and the liquid confinement structure.

According to an embodiment of the invention, there is provided an immersion type lithographic apparatus. The apparatus includes a support constructed and arranged to support a substrate, and a projection system constructed and arranged to project a patterned beam of radiation onto a target portion of the substrate. The apparatus also includes an immersion system configured to at least partially fill a space between the projection system and the substrate and/or support with a liquid. The apparatus further includes a contamination indicator constructed and arranged to generate a signal that initiates a cleaning sequence configured to clean at least a part of the lithographic apparatus. The apparatus also includes a cleaning liquid supply system that is configured to provide a cleaning liquid to the part of the lithographic apparatus, the cleaning liquid supply system comprising a plurality of different cleaners, each cleaner or combination of cleaners being configured to clean a different type and/or level of contamination in the part of the lithographic apparatus.

According to an embodiment of the invention, there is provided an immersion type lithographic apparatus that includes a support constructed and arranged to support a substrate, and a projection system constructed and arranged to project a patterned beam of radiation onto a target portion of the substrate. The apparatus also includes an immersion system configured to at least partially fill a space between the projection system and the substrate and/or support with an immersion liquid. The apparatus further includes a cleaning liquid supply system configured to provide a cleaning liquid to a part of the lithographic apparatus, and a drain switch constructed and arranged to direct the immersion liquid to a first drain, and the cleaning liquid to a second drain depending on whether the immersion liquid or the cleaning liquid is flowing out of the immersion system.

According to an embodiment of the invention, there is provided an immersion type lithographic apparatus that includes a support constructed and arranged to support a substrate. The apparatus also includes a projection system constructed and arranged to project a patterned beam of radiation onto a target portion of the substrate. The apparatus further includes an immersion system configured to at least partially fill a space between the projection system and the substrate and/or support with an immersion liquid. The apparatus also includes a cleaning liquid supply system configured to provide a cleaning liquid to a part of the lithographic apparatus. A switch is constructed and arranged to direct the immersion liquid through a liquid purification system and to direct the cleaning liquid to by-pass at least a portion of the purification system.

According to an embodiment of the invention, there is provided an immersion type lithographic apparatus that includes a support constructed and arranged to support a substrate. The apparatus also includes a projection system constructed and arranged to project a patterned beam of radiation onto a target portion of the substrate. The apparatus further includes an immersion system configured to at least partially fill a space between the projection system and the substrate and/or support with an immersion liquid. The apparatus also includes a cleaning liquid supply system configured to provide a cleaning liquid to a part of the lithographic apparatus via a first conduit. A switch is constructed and arranged to direct the immersion liquid directly to a liquid purification system via a second conduit that is separate from the first conduit and to direct the immersion liquid through the cleaning liquid supply system.

According to an embodiment of the invention, there is provided a method of cleaning an immersion type lithographic apparatus. The method includes sensing contamination within the immersion type lithographic apparatus, and providing a cleaner from a cleaning system to the immersion type lithographic apparatus. The method also includes bypassing at least a portion of a liquid purification system within the lithographic apparatus with the cleaner, and cleaning a part of the immersion type lithographic apparatus with the cleaner.

As used herein, "cleaner" includes any type of fluid that is capable of cleaning a surface. The term "fluid" includes a gas, a liquid or any combination thereof, such as a humidified gas and a liquid that includes a dissolved gas, or any other flowing medium, such as a supercritical fluid or a nematic phase liquid crystal. The term "cleaning fluid" as used herein refers to a combination of a cleaner, typically at a low concentration, with a carrier fluid. The term "cleaning liquid" as used herein refers to a cleaner that has been combined with a fluid that is predominately a liquid. The term "immersion fluid" and "immersion liquid" as used herein refers to the fluid through which a patterned beam of radiation passes through during exposure of the substrate.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIGS. 2 and 3 depict a liquid supply system for use in a lithographic projection apparatus;

FIG. 4 depicts a further liquid supply system for use in a lithographic projection apparatus;

FIGS. 6*a*-*c* depict a liquid removal device;

DETAILED DESCRIPTION

Figure 1:
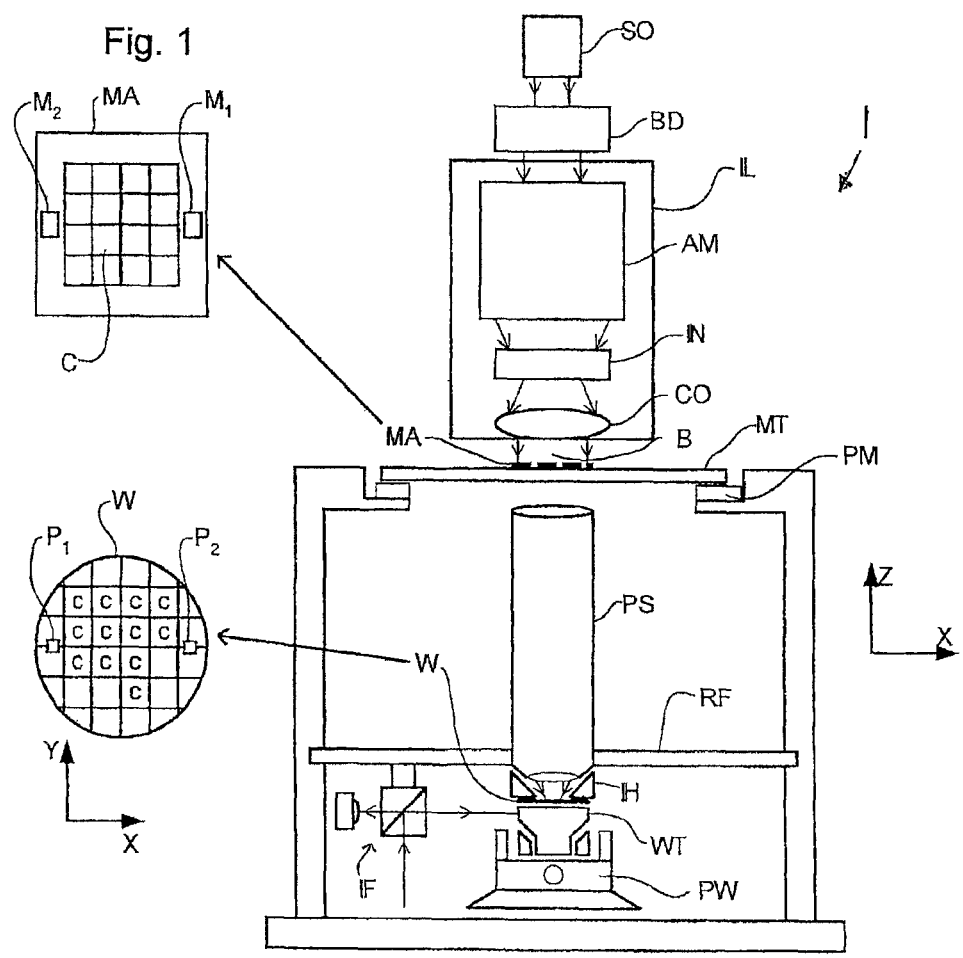
FIG. 1 depicts a lithographic apparatus according to an embodiment of the invention.

FIG. 1 schematically depicts a lithographic apparatus according to one embodiment of the invention. The apparatus comprises: an illumination system (illuminator) IL configured to condition a radiation beam B (e.g. UV radiation or DUV radiation); a support structure (e.g. a mask table) MT constructed to support a patterning device (e.g. a mask) MA and connected to a first positioner PM configured to accurately position the patterning device in accordance with certain parameters; a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The patterning device support structure holds the patterning device in a manner that depends on the orientation of the patterning device, the design of the lithographic apparatus, and other conditions, such as for example whether or not the patterning device is held in a vacuum environment. The patterning device support structure can use mechanical, vacuum, electrostatic or other clamping techniques to hold the patterning device. The patterning device support structure may be a frame or a table, for example, which may be fixed or movable as required. The patterning device support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more patterning device support structures). In such "multiple stage" machines the additional tables and/or support structures may be used in parallel, or preparatory steps may be carried out on one or more tables and/or support structures while one or more other tables and/or support structures are being used for exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AM for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. Having traversed the patterning device MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the patterning device support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the patterning device support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the patterning device support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the patterning device support structure MT and the substrate table WT are scanned synchronously while a pattern imparted to the radiation beam is projected onto a target portion C (i.e. a single dynamic exposure). The velocity and direction of the substrate table WT relative to the patterning device support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the patterning device support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

An immersion lithography solution with a localized liquid supply system IH is shown in FIG. 4. Liquid is supplied by two groove inlets IN on either side of the projection system PL and is removed by a plurality of discrete outlets OUT arranged radially outwardly of the inlets IN. The inlets IN and OUT can be arranged in a plate with a hole in its center and through which the beam of radiation is projected. Liquid is supplied by one groove inlet IN on one side of the projection system PL and removed by a plurality of discrete outlets OUT on the other side of the projection system PL, causing a flow of a thin film of liquid between the projection system PL and the substrate W. The choice of which combination of inlet IN and outlets OUT to use can depend on the direction of movement of the substrate W (the other combination of inlet IN and outlets OUT being inactive).

Another immersion lithography solution with a localized liquid supply system solution which has been proposed is to provide the liquid supply system with a liquid confinement structure (or so-called immersion hood) IH. The liquid confinement structure IH extends along at least a part of a boundary of the space between the final element of the projection system PS and the substrate table WT, as shown in FIG. 1. The liquid confinement structure may be substantially stationary relative to a projection system in the XY plane though there may be some relative movement in the Z direction (in the direction of the optical axis). A seal may be formed between the liquid confinement structure and the surface of the substrate. In an embodiment, the seal is a contactless seal such as a gas seal.

Figure 5:
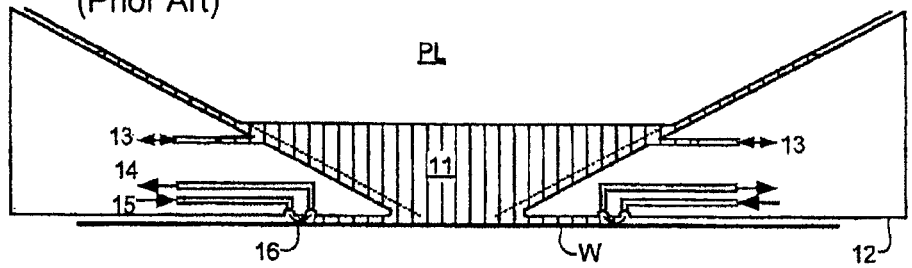
FIG. 5 depicts a further liquid supply system.

Referring to FIG. 5, liquid confinement structure 12 forms a contactless seal to the substrate around the image field of the projection system PL so that liquid is confined to fill an immersion space or reservoir 11 between the substrate surface and the final element of the projection system. The reservoir 11 is at least partly formed by the liquid confinement structure 12 positioned below and surrounding the final element of the projection system PL. Liquid is brought into the space below the projection system and within the liquid confinement structure 12. Liquid may be brought into the space and/or removed from the space by liquid port 13. The liquid confinement structure 12 extends a little above the final element of the projection system and the liquid level rises above the final element so that a buffer of liquid is provided. The liquid confinement structure 12 has an inner periphery that at the upper end, in an embodiment, closely conforms to the shape of the projection system or the final element thereof and may, e.g., be round. At the bottom, the inner periphery closely conforms to the shape of the image field, e.g., rectangular though this may not be the case.

The liquid is confined in the reservoir by a gas seal 16 formed between the bottom of the liquid confinement structure 12 and the surface of the substrate W. The gas seal is formed by gas, e.g. air or synthetic air or $N_2$ or an inert gas. The gas is provided under pressure via inlet 15 to the gap between liquid confinement structure 12 and substrate. The gas is extracted via outlet 14. The overpressure on the gas inlet 15, vacuum level on the outlet 14 and geometry of the gap are specifically arranged. Desirably, the arrangement provides a high-velocity gas flow inwards that confines the liquid. The inlet and/or outlet may be annular grooves which surround the space 11. The groove may be continuous or discontinuous. Such a system is disclosed in United States Patent Application Publication No. US 2004-0207824.

In European Patent Application Publication No. EP 1,420,300 and United States Patent Application Publication No. US 2004-0136494, each hereby incorporated in their entirety by reference, the idea of a twin or dual stage immersion lithography apparatus is disclosed. Such an apparatus is provided with two tables for supporting a substrate. Leveling measurements are carried out with a table at a first position, without immersion liquid, and exposure is carried out with a table at a second position, where immersion liquid is present. Alternatively, the apparatus has only one table.

Figure 6A:
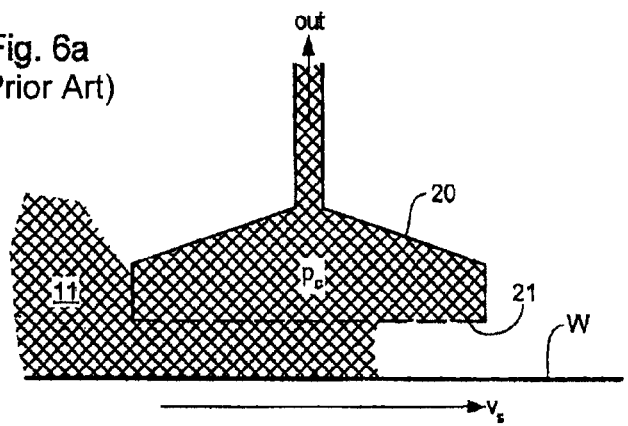
Figure 6B:
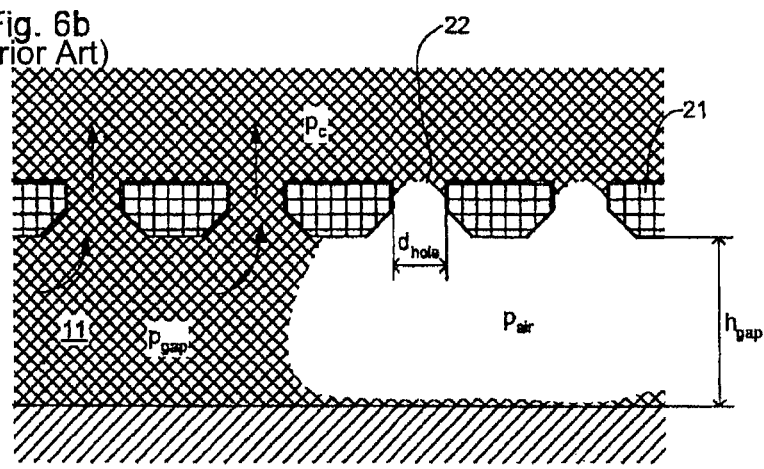

FIGS. 6a and 6b, the latter of which is an enlarged view of part of the former, illustrate a liquid removal device 20 which may be used in an immersion system to remove liquid between the immersion hood IH and the substrate W. The liquid removal device 20 comprises a chamber which is maintained at a slight underpressure $p_c$ and is filled with the immersion liquid. The lower surface of the chamber is formed of a porous member 21. The porous member 21 may be a perforated plate or a thin plate having a large number of small holes, e.g. of diameter $d_{hole}$ in the range of 5 μm to 50 μm. The lower surface is maintained at a gap height $h_{gap}$ of less than 1 mm, desirably in the range of 50 μm to 300 μm, above a surface from which liquid is to be removed, e.g. the surface of a substrate W. In an embodiment, porous member 21 is at least slightly liquidphilic, i.e., for water, hydrophilic, having a contact angle of less than 90° to the immersion liquid, e.g. water.

The underpressure $p_c$ is such that the menisci 22 formed in the holes in the porous member 21 substantially prevent gas being drawn into the chamber of the liquid removal device. However, when the porous member 21 comes into contact with liquid on the surface W there is no meniscus to restrict flow and the liquid can flow freely into the chamber of the liquid removal device. Such a device can remove most of the liquid from the surface of a substrate W, though a thin film of liquid may remain, as shown in the drawings.

To improve or maximize liquid removal, the porous member 21 should be as thin as possible. The pressure differential between the pressure in the liquid $p_{gap}$ and the pressure in the chamber $p_c$ should be as high as possible. The pressure differential between $p_c$ and the pressure of the gas in the gap $p_{air}$ should be low enough to prevent a significant amount of gas from being drawn into the liquid removal device 20. It may not always be possible to prevent gas being drawn into the liquid removal device but the porous member will prevent large uneven flows that may cause vibration. A micro-sieve made by electroforming, photo-etching and/or laser cutting can be used as the porous member 21. A suitable sieve is made by Stork Veco B.V., of Eerbeek, the Netherlands. Other porous plates or solid blocks of porous material may be used. However the pore size should be suitable to maintain a meniscus with the pressure differential that will be experienced in use.

Such a liquid removal device can be incorporated into many types of liquid confinement structure 12. One example is illustrated in FIG. 6c as disclosed in United States Patent Application Publication No. US 2006-0038968. FIG. 6c is a cross-sectional view of one side of the liquid confinement structure 12, which forms a ring (as used herein, a ring may be circular, rectangular or any other shape) at least partially around the exposure field of the projection system PS (not shown in FIG. 6c). In this embodiment, the liquid removal device 20 is formed by a ring-shaped chamber 31 near the innermost edge of the underside of the liquid confinement structure 12. The lower surface of the chamber 31 is formed by a porous member 30, as described above. Ring-shaped chamber 31 is connected to a suitable pump or pumps to remove liquid from the chamber and/or maintain the desired underpressure. In use, the chamber 31 is full of liquid but is shown empty here for clarity.

Outward of the ring-shaped chamber 31 are a gas extraction ring 32 and a gas supply ring 33. The gas supply ring 33 has a narrow slit, which may be continuous or discontinuous, in its lower part and is supplied with gas, e.g. air, artificial air or flushing gas, at a pressure such that the gas escaping out of the slit forms a gas knife 34. The gas forming the gas knife is extracted by a suitable underpressure, which may be provided by a vacuum pump connected to the gas extraction ring 32. The resulting gas flow drives residual liquid inwardly where it can be removed by the liquid removal device and/or the vacuum pump, which should be able to tolerate vapor of the immersion liquid and/or small liquid droplets. However, since the majority of the liquid is removed by the liquid removal device 20, the small amount of liquid removed via the vacuum system does not cause an unstable flow which may lead to vibration.

While the chamber 31, gas extraction ring 32, gas supply ring 33 and other rings are described as rings herein, it is not necessary that they surround the exposure field or be complete. In an embodiment, such inlet(s) and outlet(s) may simply be circular, rectangular or other type of elements extending partially along one or more sides of the exposure field, such as for example, shown in FIGS. 2, 3 and 4.

In the apparatus shown in FIG. 6c, most of the gas that forms the gas knife is extracted via gas extraction ring 32. Some gas may flow into the environment around the immersion hood and potentially disturb the interferometric position measuring system IF. This can be prevented by the provision of an additional gas extraction ring outside the gas knife.

Further examples of how such a single phase extractor can be used in an immersion hood or liquid confinement system or liquid supply system can be found, for example in European Patent Application Publication No. 1,628,163 and United States Patent Application Publication No. 2006-0158627. In most applications the porous member will be on an underside of the liquid supply system. The maximum speed at which the substrate W can move under the projection system PS is in at least part determined by the efficiency of removal of liquid through the porous member 21. One difficulty is that some of the holes may become blocked by debris, such as resist which has detached from a substrate during imaging. This may reduce the maximum speed at which the substrate and/or substrate table can be moved without leaking of liquid from the liquid supply system or liquid confinement structure.

The embodiment of the liquid confinement structure described above and illustrated in the Figures is provided as an example and is not intended to be limiting in any way. For example, the liquid confinement system may include features disclosed in United States Patent Application Publication No. 2007-0268466, such as embodiments of the gas knife and/or the liquid extractor.

With reference to FIG. 1, the lithographic apparatus 1 of an embodiment of the invention comprises an immersion system having an immersion space defined by the substrate table WT or, when present the substrate W, the liquid confinement structure IH and the projection system PS. Contamination of one or more of the surfaces that come into contact with the immersion fluid, such as a surface of the liquid confinement structure IH, the projection system PS, and/or the substrate table WT, may build up over time if not removed.

Figure 7:
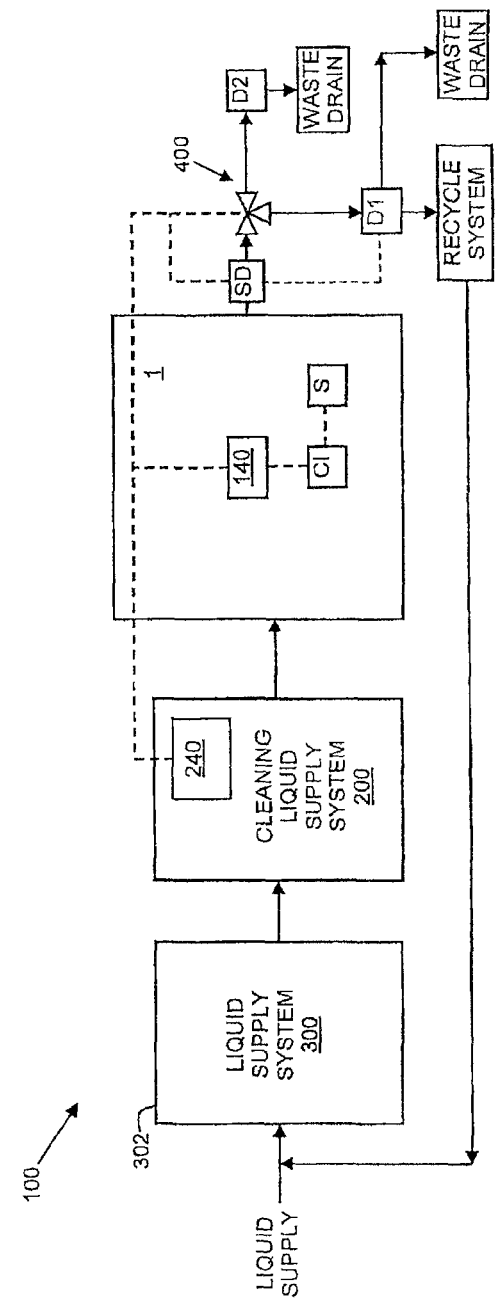
FIG. 7 depicts a schematic of an immersion type lithographic system according to an embodiment of the invention.

FIG. 7 illustrates an embodiment of an immersion type lithographic system 100 that includes the lithographic apparatus 1 of FIG. 1, as well as a cleaning liquid supply system 200. The immersion type lithographic system 100 may also include an immersion liquid supply system 300. A cleaning liquid may be supplied by the cleaning liquid supply system 200 to a surface of the lithographic apparatus that comes into contact with the immersion fluid. The cleaning liquid may help prevent the build up of contamination, and/or to remove contamination present on such a surface.

The lithographic apparatus 1 may include a contamination indicator CI. The contamination indicator CI may be used to provide an indication that cleaning is desired. For example, the contamination indicator CI may include a counter that counts the number of substrates that have been exposed in the lithographic apparatus 1 since the previous cleaning action. The contamination indicator CI may be configured to provide a signal to a controller 140 that is part of the lithographic apparatus when a certain number of substrates have been exposed. The certain number may be determined based on empirical data or may be determined based on a predicted level of contamination based on the type of materials that come into contact with the immersion fluid. In an embodiment, the contamination indicator CI may be configured to keep track of the time that has elapsed since the previous cleaning action. The contamination indicator CI may provide a signal to the controller 140 after a certain amount of time has elapsed. In an embodiment, the contamination indicator CI is part of the controller 140.

The contamination indicator CI may alternatively or additionally be in communication with one or more sensors S located within or near the lithographic apparatus that are configured to detect the amount and/or type of contamination. The sensor S may be located in or on the liquid confinement structure. In an embodiment, the sensor S may be an in-line particle counter that is configured to count contamination particles in the immersion fluid. The contamination indicator CI may be configured to provide long-term trend analysis of measurements made by the in-line particle counter. The contamination indicator CI may provide a signal when a certain, pre-determined level of particles has been reached. The signal may be provided once the level of particles has been detected for a certain, predetermined duration of time. One or more other sensors within the lithographic apparatus may be used to trigger the contamination indicator to provide a signal to the controller so that a cleaning action may commence. For example, temperature measurement of the liquid confinement structure may be monitored for an indication that liquid containment performance of the liquid confinement structure has deteriorated due to contamination. Such a sensor is described in U.S. Provisional Patent Application No. 60/960,386, filed Sep. 27, 2007, which is incorporated herein by reference in its entirety.

The immersion liquid supply system 300 may include various components that are constructed and arranged to prepare the immersion liquid for use in the lithographic apparatus 1. In an embodiment, the immersion liquid may be ultra pure water, and the immersion liquid supply system 300 may include one or more various filters that may be used to improve the purity of the water being supplied to the immersion liquid supply system 300. In an embodiment, the immersion liquid supply system 300 may be contained within a single point-of-use cabinet 302.

As illustrated in FIG. 7, the immersion liquid supply system 300 is in fluid communication with the cleaning liquid supply system 200 and the cleaning liquid supply system 200 is in fluid communication with the lithographic apparatus 1. In an embodiment, the immersion liquid supply system 300 may be in direct fluid communication with the lithographic apparatus 1 such that the liquid that flows out of the immersion liquid supply system 300 bypasses the cleaning liquid supply system 200. The immersion liquid supply system 300 may be located within an enclosure that also encloses the cleaning liquid supply system 200. The cleaning liquid supply system 200 may be located within an enclosure that also encloses the lithographic apparatus 1. In an embodiment, the immersion lithographic system 100 may be enclosed within a single enclosure.

Figure 8:
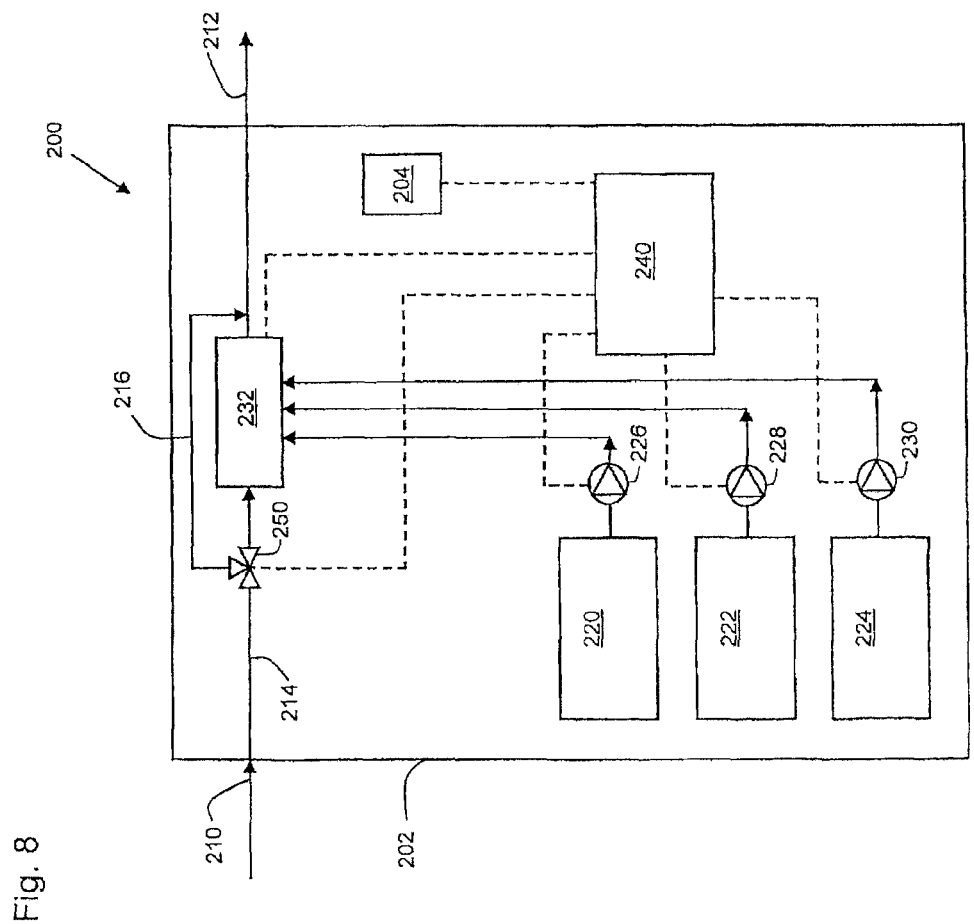
FIG. 8 depicts a schematic of a cleaning liquid supply system according to an embodiment of the invention.

FIG. 8 illustrates an embodiment of the cleaning liquid supply system 200 in greater detail. As illustrated, the cleaning liquid supply system 200 includes a single point-of-use cabinet 202, an inlet 210, an outlet 212, and a conduit 214 that connects the inlet 210 to the outlet 212. The word "conduit" as used herein may have any configuration that is suitable to convey a fluid from one location to another location, and should not be considered to be limiting in any way. The inlet 210 is in fluid communication with the immersion liquid supply system 300, and the outlet is in fluid communication with the lithographic apparatus 1. The cleaning liquid supply system 200 includes a plurality of cleaner sources or supplies 220, 222, 224. Although three cleaner sources are illustrated in FIG. 8, more or less cleaner sources may be included in the cleaning liquid supply system 200. Each of the cleaner sources 220, 222, 224 in FIG. 8 may be provided to the cleaning liquid supply system 200 in a container or may be provided from an external source via a conduit. The boxes representing the cleaner sources 220, 222, 224 schematically depict the sources of cleaner, whether in the form of an actual container, or in the form of a connection to a larger supply.

For each of the cleaner sources 220, 222, 224, a cleaner supply device 226, 228, 230 may be provided in a respective conduit that connects the cleaner sources 220, 222, 224 to the conduit 214 via a mixer 232. The cleaner supply devices 226, 228, 230 are configured provide the respective cleaner to the mixer 232 at a certain flow rate and/or for a certain duration of time. The flow rate and/or duration of time may be dependent on the type of cleaning and the duration of cleaning that should be conducted within the lithographic apparatus. The cleaner supply devices 226, 228, 230 may each include a pump, valve, or any other type of device that may be used to control the flow of the respective cleaner from the respective cleaner source 220, 222, 224. In an embodiment, at least one of the cleaner supply devices may include a mass flow controller that is used in combination with a pressurized supply container that is pressurized with a gas such as nitrogen.

The cleaning liquid supply system 200 may include a controller 240. The controller 240 is in communication with a controller 140 that is part of, or associated with, the lithographic apparatus 1, as shown in FIG. 7. As discussed above, when the contamination indicator CI indicates that contamination is present or cleaning is otherwise desired, a signal may be sent to the controller 140. The controller 140 may then send a signal to the controller 240 to indicate that a particular type of cleaning should be conducted. In an embodiment, the contamination indicator CI may be in direct communication with the controller 240. The controller 240 is in communication with the cleaner supply devices 226, 228, 230, as shown in FIG. 8, and may be configured to control operation of the cleaner supply devices 226, 228, 230 in accordance with the type of cleaning that is desired in the lithographic apparatus 1, as described in further detail below.

The cleaning liquid supply system 200 may include a flow control device 250 that is constructed and arranged to control the flow of the liquid entering the inlet 210 and whether the liquid entering the inlet 210 flows into the mixer 232 or bypasses the mixer 232 via a bypass 216. The flow control device 250 may include a three-way valve, a pump, or any other device that may control the amount and/or direction of flow of the liquid entering the cleaning liquid supply system 200. The flow control device 250 may be in signal communication with the controller 240 so that the controller 240 may control the flow of the liquid entering the cleaning liquid supply system 200. For example, if the lithographic apparatus 1 is to operate under exposure conditions, the controller 240 may provide a signal to the flow control device 250 so that the mixer 232 may be bypassed and the liquid may be provided to the lithographic apparatus 1 without any cleaner mixed therein. In an embodiment, no bypass may be provided and the liquid entering the cleaning liquid supply system 200 may flow through the mixer 232 when no cleaner is being provided to the mixer 232.

The arrangement of the cleaning liquid supply system 200 may allow different modes of cleaning to take place within the lithographic apparatus 1, particularly in a location where the immersion fluid comes into contact with a part of the lithographic apparatus, such as the liquid confinement structure, the projection system, and/or the substrate table. For example, a cleaning mode may be configured for a situation where a light or less-aggressive cleaning should take place. Such a cleaning mode may be suitable for routine cleaning after a certain number of substrate exposures or after a certain time of use, even if minimal or no contamination has been specifically detected by a contamination sensor within the lithographic apparatus. Another cleaning mode may be configured for a situation where more aggressive cleaning is desired, such as when a sensor has detected contamination within the lithographic apparatus. Additional cleaning modes that are based on specific pre-determined cleaning needs may be provided. The controller 240 may be pre-programmed with the different cleaning modes, and be configured to activate one or more of the appropriate cleaning supply devices 226, 228, 230, depending on which cleaning mode is desired. In an embodiment, the controller 240 may be reprogrammed or be programmable by a user.

The system may include a user interface 204 that is configured to allow a user to initiate a cleaning mode even if the contamination indicator CI has not provided a signal to initiate cleaning. The user interface 204 may include a display that is configured to provide the user with information being provided to the controllers 140, 240 by the contamination indication CI and/or the sensor S. The user interface 204 may be in signal communication with the controller 140 so that if a cleaning mode is initiated by the user, proper precautions may be taken within the lithographic apparatus 1 prior to the start of the cleaning mode. The controller 140 then signals the controller 240 to start the cleaning mode when the lithographic apparatus 1 is ready to receive the cleaning liquid. This may give the system added flexibility so that if an off-line contamination detection method indicates that there may be contamination within the lithographic apparatus, the user may initiate a cleaning cycle.

The cleaner provided by the cleaner source 220 may consist of or consist essentially of a water-soluble cleaning component, such as a component made up of the elements hydrogen H and oxygen O, such as hydrogen peroxide, $H_2O_2$. This material has an effective cleaning action to remove contamination, and yet there is a reduced likelihood of damage being caused to the apparatus. Cleaning with hydrogen peroxide is particularly effective for removing flakes or other particles originating from the organic process layers present on a substrate, e.g. resist and topcoat. Hydrogen peroxide is also a relatively safe and simple material to handle and is less corrosive to component surfaces than other more oxidizing materials. Suitable concentrations of hydrogen peroxide when used alone are up to 10%, in an embodiment from 0.1% to 5%. Typically, the concentration that may be used is 2.5%.

The cleaner provided by the cleaning source 222 may consist of or consist essentially of ozone, $O_3$. In an embodiment, the cleaning liquid provided to the lithographic apparatus contains ozone. The ozone may be generated in-situ as described in, for example, U.S. Patent Application No. 60/935,037, filed on Jul. 24, 2007, which is incorporated herein by reference in its entirety, or an external ozone source may be used. Concentrations of ozone may be selected from 1 ppm to 50 ppm, for example selected from 1 ppm to 20 ppm, or selected selected from 1 ppm to 10 ppm.

In an embodiment, the cleaning liquid may consist of or consist essentially of ultra-pure water containing hydrogen peroxide from cleaning source 220 and ozone from cleaning source 222, which creates a cleaner commonly known as peroxone. For example, if the controller 240 determines that a more aggressive cleaning mode should be used to clean the lithographic apparatus, the controller 240 may signal the one or more cleaner supply devices 226, 228, 230 to provide suitable amounts of the respective cleaners from the cleaning sources 220, 222, 224 to the mixer. For example, the combination of hydrogen peroxide and ozone is a reactive mixture which will in part spontaneously react to produce the highly oxidizing species OH (hydroxyl radical). This combination is advantageous since the OH radical can be produced without the application of UV radiation. All wetted surfaces of the immersion space may therefore be cleaned, and cleaning is not limited to a surface which can be exposed to UV radiation. Cleaning with peroxone is effective for many types of contamination which can be difficult to remove with a weaker cleaning agent, such as oxygen, ozone, and hydrogen peroxide.

Typical concentrations of ozone in the cleaning liquid are selected from 0.1 ppm to 20 ppm, for example at least 1 ppm, 2 ppm or at least 5 ppm. The concentration of ozone may be typically 15 ppm or 12 ppm. About 10 ppm is desirable. Typical concentrations of hydrogen peroxide in the cleaning liquid are selected from 0.1 ppm to 10 ppm, for example at least 0.5 ppm or at least 1 ppm. The concentration of hydrogen peroxide may be typically 8 ppm or 5 ppm. About 2 ppm hydrogen peroxide is desirable. The peroxone mixture may be more effective when used with a ratio by concentration of hydrogen peroxide to ozone of 0.2:1 to 0.5:1. In an embodiment, the concentrations of the components of the mixture may be 2.5 ppm hydrogen peroxide and 10 ppm ozone.

In an embodiment, at least one of the cleaner sources 220, 222, 224 may include another cleaner, such as a detergent, soap, an acid, an alkaline, or a solvent, such as a non-polar organic solvent or a polar organic solvent, or any other suitable cleaner for the lithographic apparatus. For example, the cleaner may include diethylene glycol monobutyl ether and/or ethoxylated secondary C12-14-alcohol, e.g. aldyloxypolyethyleneoxyethanol. In an embodiment, the cleaner may be a mixture of water, diethylene glycol monobutyl ether, and ethoxylated secondary C12-14-alcohol, such as TLDR-A001 or TLDR-A001-C4, which are manufactured by Tokyo Ohko Kogyo Co., Ltd. The controller 240 may be programmed to provide such a cleaner in another cleaning mode, which may be defined by the user.

In an embodiment, the cleaner may include water, a solvent selected from one or more glycol ethers, esters, alcohols and ketones, and a surfactant. In an embodiment, the water is clean, for example the water may be ultra-pure water. The solvent should be chosen to have a reasonable match with the contamination that is to be removed. This can be determined, for example, using the Hansen theory (see, for example, Hansen Solubility Parameters, Charles M. Hansen, $2^{nd}$ edition, CRC press, ISBN 0-8493-7248). Typically, the solvent will have a match, determined using the Hansen theory, of at least 50% (i.e. it will be positioned near the center of the Hansen solubility sphere). The solvent used will also in general be completely mixable in water. In an embodiment, the solvent may have a solubility of more than 10 wt % in water. In an embodiment, the solvent may have a flash point above 38° C., for example above 70° C. or above 93° C.

Glycol ethers for use in the cleaning fluid may include propylene glycolethers, such as propylene glycol methyl ether (PGME), dipropylene glycol methyl ether (DPGME), tripropylene glycol methyl ether (TPGME), propylene glycol ethyl ether (PGEE), propylene glycol normal propyl ether (PGPE), dipropylene glycol normal propyl ether (DPGPE), propylene glycol normal butyl ether (PGBE), dipropylene glycol normal butyl ether (DPGBE), tripropylene glycol normal butyl ether (TPGBE) and propylene glycol tertiary butyl ether (PGTBE); ethylene glycolethers, such as diethylene glycol methyl ether (DEGME), diethylene glycol ethyl ether (DEGEE), diethylene glycolpropyl ether (DEGPE), ethylene glycol butyl ether (EGBE) and diethylene glycol butyl ether (DEGBE); propylene glycol ether acetates, such as propylene glycol methyl ether acetate (PGMEA) and dipropylene glycol methyl ether acetate (DPGMEA), and ethylene glycol ether acetates, such as ethylene glycol butyl ether acetate (EGBEA) and diethylene glycol butyl ether acetate (DEGEA). In an embodiment, the glycol ether may be selected from DEGBE, DEGPE, PGME and DPGME. In an embodiment, the glycol ether is DEGBE.

Esters for use in the cleaning fluid may include compounds which have an ester functionality. Suitable compounds include methyl lactate, ethyl lactate, propyl lactate, butyl lactate, gamma butyrolactone, methyl acetate, ethyl acetate, propyl acetate, butyl acetate, isobutyl acetate, t-butyl acetate and gamma butyrol acetate. In an embodiment, the ester is a dibasic ester. In an embodiment, the ester is ethyl lactate or butyrolactate.

Ketones for use in the cleaning fluid may include cyclohexanone or diacetone alcohol.

Alcohols for use in the cleaning fluid may include methanol, ethanol, propanol, such as isopropanol, t-butyl alcohol, 4-methyl-2-pentanol and cyclohexanol.

In an embodiment, the solvent is selected from one or more glycol ethers or esters. In one embodiment, the solvent is selected from one or more glycol ethers.

In an embodiment, the solvent is selected from DEGBE or ethyl lactate. In an embodiment, the solvent is DEGBE.

In an embodiment, the surfactant is selected from one or more nonionic, cationic or anionic surfactants. In an embodiment, the surfactant is selected from one or more nonionic surfactants. In an embodiment, the surfactant comprises a nonionic surfactant which is an ethylene oxide/propylene oxide block copolymer with a molecular weight from 1000 to 3000. A suitable such surfactant is Pluronic® L61 from BASF. In an embodiment, the surfactant comprises a defoaming wetting agent such as Envirogen® AD01 from Air Products.

In an embodiment, the cleaning fluid further comprises a pH adjustment chemical. If present, the pH adjustment can be used to ensure that the pH of the cleaning fluid is from 7 to 10, for example from 8 to 10 or from 9 to 10. Suitable pH adjustment chemicals may include inorganic bases such as sodium hydroxide, potassium hydroxide or a phosphate buffer. Increasing the pH of the solution can decrease the adhesive forces between the contaminant and the surface and may therefore result in more efficient cleaning. However, increasing the pH beyond 10 should in general be avoided since this may lead to damage to parts of the lithographic apparatus, for example the lens.

In an embodiment, the cleaning fluid may be free from nitrogen containing compounds. In an embodiment, the cleaning fluid may be free from ammonia and amines. These compounds are volatile alkalines and may adversely affect the processing of the photo resist.

In an embodiment, at least one of the cleaner sources may include oxygen. The concentration of oxygen in the cleaning liquid may be up to 10 ppm, for example up to 5 ppm or up to 2 ppm. The maximum oxygen concentration is the maximum oxygen saturation using atmospheric air. A gas mixture enriched with oxygen may be used, which may achieve a higher saturation level. Using an oxygen enriched gas mixture, a concentration of up to 50 ppm may be achieved. The use of oxygen as the cleaner may be highly beneficial from a safety point of view. Further, oxygen can be activated into more oxidizing cleaning species such as ozone in-situ, by application of UV radiation. Consequently, effective cleaning may be achieved, including the removal of contaminants such as partly carbonized materials which can be difficult to remove with known cleaning agents.

In an embodiment, the cleaning power of a cleaning liquid of an embodiment of the invention may be increased by UV irradiation of the cleaning liquid. In the case of a cleaning liquid which contains ultra-pure water and oxygen, such irradiation is particularly desired since this will generate ozone in situ in the immersion space. The ozone may be further activated in the lithographic apparatus to provide highly oxidizing species such as the OH radical. In an embodiment in which the cleaning liquid contains hydrogen peroxide and/or ozone, cleaning is highly effective without irradiation. However, UV irradiation may enable, or increase, the formation of the highly reactive OH radical and thereby provide improved cleaning effect. For example, the presence of the OH species will provide improved cleaning of carbonized or partly carbonized contaminants in the immersion space.

The UV radiation used may be provided by the projection system of the apparatus, or by a separate UV radiation source such as a low pressure Hg lamp or an excimer laser. An appropriate wavelength is typically about or less than 250 nm. Where ozone is present in the cleaning liquid, a wavelength of less than 220 nm is desired since a wavelength of greater than 220 nm will induce breakdown of ozone to oxygen. In an embodiment, 193 nm wavelength radiation may be used.

For embodiments in which UV radiation should not be used in combination with the cleaner, the controller 240 may be configured to provide a signal to the controller 140 of the lithographic apparatus indicating that the cleaner is about to be supplied to the lithographic apparatus. In response, the controller 140 may turn off the radiation source or may otherwise prevent the radiation from reaching the cleaning liquid as the cleaning liquid flows through the lithographic apparatus.

The cleaning liquid exiting the cleaning liquid supply system 200 via the outlet 212 may be supplied to the immersion space, for example by flushing the cleaning liquid through the lithographic apparatus. The cleaning liquid may be supplied to the immersion space using the same inlet system as the immersion liquid, for example inlet IN as depicted FIGS. 2, 3 and 4 or inlet 13 of FIG. 5. In an embodiment, the cleaning liquid may be supplied to a dedicated cleaning station located within the lithographic apparatus, such as on the substrate table. Thus, a continuous flow of cleaning liquid through the immersion space may be used. The flushing process may be continued for any desired length of time, but it is envisaged that flushing for, e.g., up to half an hour, for example 15 minutes, up to 10 minutes or even up to 5 minutes would be sufficient to provide a cleaning effect. The cleaning liquid may additionally or alternatively be supplied to the immersion space and held in the space for a period of time (e.g. up to 15 minutes, up to 10 minutes or up to 5 minutes), before being flushed or pumped out. This process may be repeated one or more times.

Following cleaning, the immersion space may be rinsed with ultra-pure water. An advantage of one or more of the cleaning liquids described herein is the ease of removing all traces of the cleaning liquid by rinsing with ultra-pure water. Thus, rinsing may be completed within, for example, half an hour.

The entire cleaning process may therefore be completed with a maximum down-time of the apparatus of only an hour. Cleaning may therefore be carried out more frequently. Frequent cleaning has a benefit that a contamination level may be kept to a very low level at all times. If desired, the cleaning process described herein may be carried out in combination with one or more less frequent cleaning processes which may be off-line, such as mechanical spraying or mega-sonic cleaning techniques. However, a benefit of the use of the cleaning process and/or cleaning liquid described herein is that the frequency of carrying out such an off-line cleaning method may be reduced or such an off-line technique may be eliminated entirely.

In an embodiment, cleaning may be carried out in the absence of a substrate. This means that the substrate table WT is exposed to the cleaning liquid. As depicted in FIG. 1, only a part of the substrate table is normally part of the immersion space. In an embodiment, the substrate table may be moved while the cleaning liquid is within the immersion space in order that different parts of the substrate table are exposed to the cleaning liquid. This may enable substantially the entire substrate table to be cleaned. The substrate table may be a source of contaminants for the immersion fluid. Cleaning without the presence of a substrate may permit the substrate table to cross-contaminate other surfaces of the immersion system. In an embodiment, the cleaning may be done with the substrate in place on the substrate table, or with a dummy substrate on the substrate table.

All the embodiments of the cleaning liquid supply system may have one or more sensors to determine the concentration of the cleaner being supplied to the lithographic apparatus. The sensor may be located near the outlet 212 of the cleaning liquid supply system 200, or in the conduit that connects the cleaning liquid supply system 200 to the lithographic apparatus 1.

The cleaning liquid may pass through the liquid confinement structure in order to remove contamination on a surface of the immersion space and/or other surface that comes into contact with the immersion fluid. Used cleaning liquid, which may include a dissolved gas, may then flow out of the liquid confinement structure and into an outlet system, together with, for example, the air contained in the liquid confinement structure. The outlet fluid may then be passed through a separator which separates the liquid and gas phases. The gas phase may be released via a gas bleed which is reached after the gas has passed through a charcoal filter to remove ozone, if present. Other methods may be used to remove ozone from the used cleaning liquid. For example, the ozone may be removed as the gas phase passes under the illumination of a UV radiation destructor lamp. The liquid phase may then pass through a degasser which removes dissolved ozone. Any appropriate type of degasser may be used, for example a membrane-based degasser, an aeration degasser or a column degasser. The liquid that exits the degasser may then be drained.

As illustrated in FIG. 7, a drain switch 400 may be used to direct the flow of the liquid exiting the lithographic apparatus to at least one of a plurality of different drains D1, D2. Although two drains are illustrated, additional drains may be used. The illustrated embodiment is not intended to be limiting in any way. The drain switch 400 may be in communication with the controller 240 and/or the controller 140. The drain switch 400 may include a manifold that has at least one inlet that is in fluid communication with the lithographic apparatus, and outlets that are each in fluid communication with the drains D1, D2, respectively. In the illustrated embodiment, the manifold is a three-way valve, but any suitable configuration may be used.

One of the drains D1 may further include a three-way valve or any other type of manifold that may allow the user to direct the fluid to a recycle system or to a waste drain for disposal. Such a recycle system may be used to allow the fluid to be reused in the lithographic apparatus or in any other apparatus, either for cooling purposes or even as an immersion liquid. Potential benefits of such a recycle system may include reducing the cost to operate the lithographic apparatus by reducing downtime and improving the speed of operation. In addition, the inclusion of the drain switch 400 may avoid the presence of a cleaner in a normal liquid (e.g., water) drain. The other drain D2 may be constructed and arranged to safely dispose of any liquid flowing therethrough, including the cleaning liquid that has exited the lithographic apparatus. The drain D2 may be connected to a stripper or any other device that may further process the liquid prior to final disposal in a waste drain. In an embodiment, the two waste drains that are illustrated in FIG. 7 may be the same waste drain.

By having the drain switch 400 in signal communication with the controllers 140, 240, the drains D1, D2 may be switched upon initiation of a cleaning sequence so that the cleaning liquid may flow to the drain D2 rather than the drain D1. Alternatively, or in addition, a sensor SD that is in communication with the controllers 140, 240 may be located in between the outlet of the lithographic apparatus and the drain switch 400. The sensor SD may be configured to detect whether there is cleaner in the liquid flowing to the drain switch 400 so that the drain switch 400 may be switched to the appropriate configuration. Such a configuration may allow the liquid to flow to the appropriate drain for further handling. For example, if the liquid is to be recycled, a certain threshold for contaminants (e.g., cleaner) may be used to determine whether the liquid is pure enough to be recycled. If the liquid contains contaminants above the threshold, the liquid may be directed to the waste drain. The certain threshold may be a predetermined.

In an embodiment, the immersion lithographic system 100 may include multiple drain switches that are in fluid communication with multiple outlets of the lithographic apparatus and are in signal communication with the controller 140. Such an arrangement may allow other fluids that are used in the lithographic apparatus, such as a cooling fluid, to be directed to the appropriate drain, which may be defined by the user.

Figure 9:
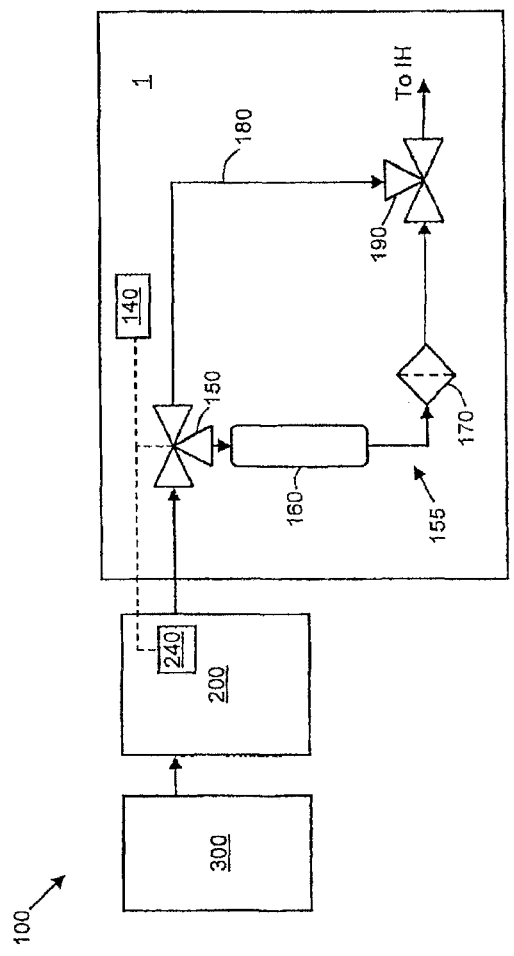
FIG. 9 depicts a schematic of an immersion type lithographic system according to an embodiment of the invention.

As illustrated in FIG. 9, the immersion lithographic system 100 may include a switch 150 that is constructed and arranged to allow the cleaning liquid to by-pass at least a portion of a liquid purification system 155 of the lithographic apparatus 1. In the illustrated embodiment, the liquid purification system 155 includes a heat exchanger 160 and a particle filter 170. The liquid purification system 155 may also include at least one degassing unit (not shown) that is configured to decrease the dissolved gas content of the liquid flowing therethrough. The heat exchanger 160 and particle filter 170 typically have relatively large volumes and provide for a relatively low flow velocity, which may make it difficult to flush chemicals therethrough. It is desirable to flush the cleaning liquid out of the lithographic apparatus 1 prior to operating the lithographic apparatus 1 in an exposure mode.

In order to reduce or minimize the duration of time it takes to flush the cleaning liquid out of the lithographic apparatus 1, it is desirable to prevent the cleaning liquid to pass through the heat exchanger 160 and the particle filter 170. The controller 140 may be configured to provide a signal to the switch 150 to direct the flow of the cleaning liquid to a by-pass 180 when a cleaning mode has been initiated by the controller 240 of the cleaning liquid supply system 200. The switch 150 may be in the form of a three-way valve, as illustrated, or may be any other type of suitable manifold. A valve 190, such as a three-way valve, may be provided at the end of the by-pass 180 to rejoin the flow path with a path that exits the by-passed portion of the liquid purification system 155. The cleaning liquid may then flow to other parts of the lithographic apparatus, such as the liquid confinement structure IH. At the end of the cleaning mode, the same flow path, i.e. through the by-pass 180, may be flushed with a fluid that does not include a cleaner, such as the immersion liquid, or any other suitable fluid.

Figure 10:
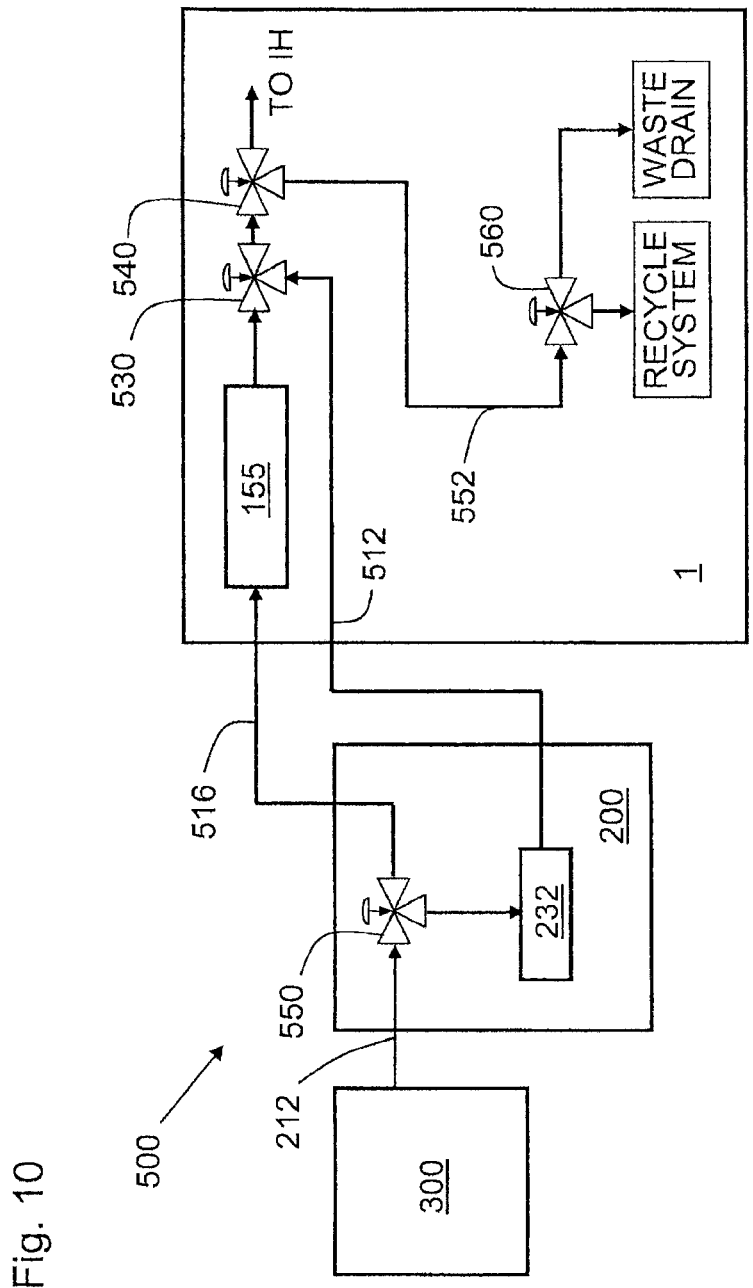
FIG. 10 depicts a schematic of an immersion type lithographic system according to an embodiment of the invention.

FIG. 10 illustrates an embodiment of an immersion lithographic system 500 that is constructed and arranged to deliver the cleaning liquid from the cleaning liquid supply system 200 to a location within the lithographic apparatus 1 that is closer in proximity to the liquid confinement structure IH, as compared to the embodiments of the immersion lithographic system 100 illustrated in FIGS. 7 and 9. As illustrated, the cleaning liquid supply system 200 may include a flow control device 550 that is constructed and arranged to control the flow of the liquid entering the inlet 210 and whether the liquid entering the inlet 210 flows into the mixer 232 or bypasses the mixer 232 via a by-pass 516. In an embodiment, the flow control device 550 may not be part of the cleaning liquid supply system by may be part of the liquid supply system 300, or may be located in between the liquid supply system 300 and the cleaning liquid supply system 200.

The flow control device 550 may include a three-way valve, a pump, or any other device that may control the amount and/or direction of flow of the liquid entering the cleaning liquid supply system 200. The flow control device 550 may be in signal communication with the controller 240 (discussed above) so that the controller 240 may control the flow of the liquid entering the cleaning liquid supply system 200. For example, if the lithographic apparatus 1 is to operate under exposure conditions, the controller 240 may provide a signal to the flow control device 550 so that the mixer 232 may be by-passed and the liquid may be provided to the lithographic apparatus 1 without any cleaner mixed therein.

As illustrated in FIG. 10, the by-pass 516 extends from the flow control device 550 to the liquid purification system 155, the details of which are discussed above. Thus, the by-pass 516 is configured to by-pass the cleaning liquid supply system 200 such that the by-pass 516 cannot be contaminated with cleaners from the cleaning liquid supply system 200. A separate conduit 512 extends from the mixer 232 in the cleaning liquid supply system 200 to a flow control device 530 that is located downstream from the liquid purification system 155. Desirably, the flow control device 530 is located in close proximity to the liquid confinement structure IH in the lithographic apparatus 1 so that the amount of time that is needed to flush the cleaning liquid out of the liquid confinement structure IH may be reduced, as discussed in further detail below.

As illustrated, another flow control device 540 is located between the flow control device 530 and the liquid confinement structure IH and is configured to direct the flow of the liquid passing therethrough to the liquid confinement structure IH or to a drain switch 560 via a conduit 552. The drain switch 560 may be a three way valve, or any other type of flow control device that can direct the flow of a liquid entering the drain switch to the recycle system or to the waste drain, as discussed above.

In operation, when the immersion lithographic apparatus is exposing a substrate, the flow control device 550 may be configured to direct the liquid received from the liquid supply system 300 via the inlet 210 to the liquid purification system 155 via the by-pass 516. After the liquid has passed through the liquid purification system, it may flow through the flow control devices 530, 540 and to the liquid confinement structure IH. If desired, the flow control device 540 may be switched so that the liquid may flow to the drain switch 560 rather than to the liquid confinement system IH. If the liquid has not been contaminated, it may be directed to the recycle system, but if contamination has been detected in the liquid, the liquid may be directed to the waste drain.

When it is desired to clean the liquid confinement system IH, the flow control device 550 is signaled to direct the liquid received from the liquid supply system 300 via the inlet 210 to the mixer 232, where one of more of the cleaning agents discussed above may be mixed with the liquid, as discussed above. The resulting cleaning liquid may then flow directly to the flow control device 530, through the flow control device 540 and to the liquid confinement system IH. Upon completion of a cleaning cycle, the flow control device 530 may block the flow of cleaning liquid from the conduit 512 and may allow the liquid from the liquid purification system 155 to flush any remaining cleaning liquid out of the lithographic apparatus 1. At about the same time, the flow control device 550 may switch the direction of the liquid flowing though the inlet 210 to enter the by-pass 516 rather than the mixer 232. The flow control device 540 and drain switch 560 may also be controlled to allow any liquid having traces of the cleaners to be directed to the waste drain.

By allowing the liquid from the liquid supply system 300 to flow through a separate conduit 516 to the lithographic apparatus 1, rather than the same conduit 512 that is used to deliver the cleaning fluid to the immersion lithographic apparatus 1, the amount of time it takes to flush the cleaning fluid out of the immersion lithographic apparatus 1 may be reduced.

Features of each of the embodiments herein may be combined with features of one or more of the other embodiments, as appropriate.

In a first aspect, there is provided an immersion type lithographic apparatus comprising an immersion system configured to at least partially fill an immersion space with an immersion liquid, an indicator configured to indicate whether a part of the lithographic apparatus should be cleaned, and a cleaning liquid supply system configured to supply a cleaning liquid comprising a cleaner to the part of the lithographic apparatus, the cleaner being at least one of a plurality of different cleaners, each cleaner or combination of cleaners being configured to clean a different type and/or level of contamination in the part of the lithographic apparatus, and a controller configured to control which of the plurality of cleaners is provided to the part of the lithographic apparatus, based on an indication received from the indicator. Optionally, the immersion type lithographic apparatus further comprises an in-line cleaning cabinet, wherein the plurality of different cleaners and the controller are located within the in-line cleaning cabinet. Desirably, the immersion type lithographic apparatus is configured such that the immersion liquid passes through the in-line cleaning cabinet prior to partially filling the immersion space. Optionally, one of the plurality of different cleaners comprises hydrogen peroxide. Optionally, one of the plurality of different cleaners comprises ozone. Desirably, the cleaner supplied is peroxone. Optionally, one of the plurality of different cleaners comprises at least one selected from the group consisting of: a soap, an alkalic fluid, an acid, and a solvent. Desirably, one of the plurality of different cleaners comprises a soap. Desirably, one of the plurality of different cleaners comprises at least one solvent selected from one or more glycol ethers, esters, alcohols, and ketones. Optionally, one of the plurality of different cleaners comprises diethylene glycol monobutyl ether and/or ethoxylated secondary C12-14-alcohol. Optionally, the indicator comprises at least one selected from the group consisting of: i) an exposure counter configured to count a number of substrates exposed since a previous cleaning action; ii) a timer configured to time the duration since a previous cleaning action; iii) a particle counter configured to count a number of contaminant particles that have exited the immersion system over a certain amount of time; and iv) a sensor configured to sense a certain level of contamination in the lithographic apparatus. Optionally, the immersion type lithographic apparatus further comprises a first drain configured to receive the immersion liquid from the immersion system, a second drain configured to receive the cleaning liquid, and a switch configured to direct liquid flowing out of the immersion system to the first drain or the second drain depending on whether the immersion liquid or the cleaning liquid is flowing out of the immersion system. Desirably, the first drain is connected to an immersion liquid recycle system configured to purify the immersion liquid for reuse in the immersion system.

In a second aspect, there is provided an in-line cleaning cabinet for an immersion type lithographic apparatus, the in-line cleaning cabinet comprising a fluid outlet constructed and arranged to provide a cleaning fluid to the immersion type lithographic apparatus, a plurality of cleaner supply devices in fluid communication with the fluid outlet, each of the cleaner supply devices being constructed and arranged to supply a cleaner to the fluid outlet, and a controller configured to control the plurality of cleaner supply devices based on a level and/or type of contamination within the immersion type lithographic apparatus so that the cleaning fluid comprises at least one of the cleaners. Optionally, the in-line cleaning cabinet further comprises a fluid inlet constructed and arranged to receive an immersion fluid to be used in the immersion type lithographic apparatus, the fluid inlet being in fluid communication with the fluid outlet, and a mixer in fluid communication with the fluid inlet, the plurality of cleaner supply devices, and the fluid outlet, the mixer being constructed and arranged to mix at least one of the cleaners with the immersion fluid, wherein the mixer is in signal communication with the controller. Desirably, the immersion fluid comprises ultra pure water. Optionally, the controller is configured to communicate with a controller of the immersion type lithographic apparatus. Desirably, the controller of the in-line cleaning cabinet is configured to prevent the cleaning fluid from flowing out of the fluid outlet when an exposure is taking place within the immersion type lithographic apparatus. Optionally, at least one of the cleaners comprises hydrogen peroxide. Desirably, the in-line cleaning cabinet further comprises a storage container for the hydrogen peroxide. Optionally, least one of the cleaners comprises ozone. Desirably, the in-line cleaning cabinet further comprises an ozone generator. Optionally, at least one of the cleaners comprises diethylene glycol monobutyl ether and/or ethoxylated secondary C12-14-alcohol. Optionally, the controller is configured to communicate with a contamination indicator in the immersion type lithographic apparatus, and wherein the contamination indicator is configured to detect the level and/or type of contamination within the immersion type lithographic apparatus.

In a third aspect, there is provided a method of cleaning an immersion type lithographic apparatus, the method comprising sensing contamination within the immersion type lithographic apparatus, selecting a cleaning mode from a plurality of cleaning modes in response to the sensing, and providing a cleaner from a cleaning system to the contaminated part of the immersion type lithographic apparatus based on the selected cleaning mode. Optionally, each of the plurality of cleaning modes corresponds to a different cleaner. Optionally, the selecting is based on the type and/or level of sensed contamination. Optionally, the cleaner provided in one of the plurality of cleaning modes comprises hydrogen peroxide. Desirably, the cleaner provided in one of the plurality of cleaning modes comprises peroxone. Optionally, the cleaner provided in one of the plurality of cleaning modes comprises at least one selected from the group consisting of: ozone, an alkaline, a soap, and an acid. Desirably, one of the plurality of different cleaners comprises a soap. Desirably, one of the plurality of different cleaners comprises at least one solvent selected from one or more glycol ethers, esters, alcohols, and ketones. Optionally, the cleaner provided in one of the plurality of cleaning modes comprises diethylene glycol monobutyl ether and/or ethoxylated secondary C12-14-alcohol. Optionally, the method further comprises switching a drain switch from one position to another position so that the cleaner flows out of the immersion type lithographic apparatus to one of a plurality of drains. Optionally, the cleaning system is located in an in-line cleaning cabinet, the in-line cleaning cabinet being in fluid communication with the immersion type lithographic apparatus. Optionally, the method further comprises mixing the cleaner with a fluid being provided to the immersion type lithographic apparatus. Desirably, the fluid comprises ultra pure water.

In a fourth aspect, there is provided a method for supplying a cleaning fluid from an in-line cleaning cabinet to an immersion type lithographic apparatus, the method comprising supplying a first cleaner to the in-line cleaning cabinet, supplying a second cleaner to the in-line cleaning cabinet, detecting an amount and/or type of contamination within the immersion type lithographic apparatus, determining a ratio of the first cleaner and the second cleaner to mix with a fluid carrier based on the detecting, and supplying a mixture of the fluid carrier and the first cleaner and/or the second cleaner to the immersion type lithographic apparatus. Optionally, the method further comprises supplying the fluid carrier to the in-line cleaning cabinet. Optionally, the method further comprises controlling when the mixture is supplied to the immersion type lithographic apparatus based on operation of the immersion type lithographic apparatus. Desirably, the method further comprises preventing the mixture from being supplied to the immersion type lithographic apparatus when an exposure operation is taking place in the immersion type lithographic apparatus. Optionally, the method further comprises mixing the first cleaner and/or the second cleaner with the fluid carrier. Desirably, the first cleaner comprises hydrogen peroxide, and wherein the mixing comprises mixing the hydrogen peroxide with the fluid carrier so that the mixture comprises about 1% of the hydrogen peroxide. Desirably, the first cleaner comprises hydrogen peroxide and the second cleaner comprises ozone, and wherein the mixing comprises mixing the hydrogen peroxide and the ozone so that the mixture comprises between about 3 ppm and about 5 ppm hydrogen peroxide and about 10 ppm ozone. Desirably, the supplying the second cleaner comprises generating the ozone. Optionally, the fluid carrier comprises ultra pure water. Optionally, the method further comprises selecting a cleaning mode from a plurality of cleaning modes based on the detecting, wherein the ratio is determined based on the selected cleaning mode.

In a fifth aspect, there is provided an immersion type lithographic system, comprising an immersion type lithographic apparatus, comprising a support constructed and arranged to support a substrate, a projection system constructed and arranged to project a patterned beam of radiation onto a target portion of the substrate, and a liquid confinement structure configured to at least partially fill a space between the projection system and the substrate and/or support with a liquid, a liquid supply system constructed and arranged to supply the liquid to the liquid confinement structure, and a cleaning system constructed and arranged to supply a cleaner to the immersion type lithographic apparatus, the cleaning system being in fluid communication with the liquid supply system and the liquid confinement structure. Optionally, the cleaning system comprises a plurality of different cleaners, each cleaner or combination of cleaners being configured to clean a different type and/or level of contamination in the part of the lithographic apparatus, and a controller configured to control which of the plurality of cleaners is provided to the lithographic apparatus, based on input received from a sensor. Desirably, one of the plurality of different cleaners comprises hydrogen peroxide. Desirably, one of the plurality of different cleaners comprises ozone. Desirably, one of the plurality of different cleaners comprises at least one selected from the group consisting of: a soap, an alkalic fluid, an acid, and a solvent. Desirably, one of the plurality of different cleaners comprises a soap. Desirably, one of the plurality of different cleaners comprises at least one solvent selected from one or more glycol ethers, esters, alcohols, and ketones. Desirably, one of the plurality of different cleaners comprises diethylene glycol monobutyl ether and/or ethoxylated secondary C12-14-alcohol. Optionally, the cleaning system comprises an in-line cleaning cabinet. Desirably, the in-line cleaning cabinet comprises a fluid outlet constructed and arranged to provide a cleaning fluid comprising the cleaner to the immersion type lithographic apparatus, a plurality of cleaner supply devices in fluid communication with the fluid outlet, each of the cleaner supply devices being constructed and arranged to supply a cleaner to the fluid outlet, and a controller configured to control the plurality of cleaner supply devices based on a level and/or type of contamination within the immersion type lithographic apparatus so that the cleaning fluid comprises at least one of the cleaners from the plurality of cleaner supply devices. Optionally, the immersion type lithographic system further comprises an enclosure, wherein the liquid supply system and the cleaning system are located within the enclosure. Optionally, the immersion type lithographic system further comprises an enclosure, wherein the cleaning system and the immersion type lithographic apparatus are located within the enclosure.

In a sixth aspect, there is provided an immersion type lithographic apparatus comprising a support constructed and arranged to support a substrate, a projection system constructed and arranged to project a patterned beam of radiation onto a target portion of the substrate, an immersion system configured to at least partially fill a space between the projection system and the substrate and/or support with an immersion liquid, a contamination indicator constructed and arranged to generate a signal that initiates a cleaning sequence configured to clean at least a part of the lithographic apparatus, and a cleaning liquid supply system configured to provide a cleaning liquid to the part of the lithographic apparatus, the cleaning liquid supply system comprising a plurality of different cleaners, each cleaner or combination of cleaners being configured to clean a different type and/or level of contamination in the part of the lithographic apparatus. Optionally, the indicator comprises at least one selected from the group consisting of: i) an exposure counter configured to count a number of substrates exposed since a previous cleaning action; ii) a timer configured to time the duration since a previous cleaning action; iii) a particle counter configured to count a number of contaminant particles that have exited the immersion system over a certain amount of time; and iv) a sensor configured to sense a certain level of contamination in the lithographic apparatus. Optionally, the immersion type lithographic apparatus further comprises a first drain configured to receive the immersion liquid from the immersion system, a second drain configured to receive the cleaning liquid provided during a cleaning sequence, and a switch configured to direct liquid flowing out of the immersion system to the first drain or the second drain depending on whether the immersion liquid or the cleaning liquid is flowing out of the immersion system. Desirably, the first drain is connected to an immersion liquid recycle system configured to purify the immersion liquid for reuse in the immersion system.

In a seventh aspect, there is provided an immersion type lithographic system comprising a support constructed and arranged to support a substrate, a projection system constructed and arranged to project a patterned beam of radiation onto a target portion of the substrate, an immersion system configured to at least partially fill a space between the projection system and the substrate and/or support with a liquid, a cleaning liquid supply system configured to provide a cleaning liquid to a part of the lithographic apparatus, and a drain switch constructed and arranged to direct the immersion liquid to a first drain, and the cleaning liquid to a second drain depending on whether the immersion liquid or the cleaning liquid is flowing out of the immersion system.

In an eighth aspect, there is provided an immersion type lithographic apparatus comprising a support constructed and arranged to support a substrate, a projection system constructed and arranged to project a patterned beam of radiation onto a target portion of the substrate, an immersion system configured to at least partially fill a space between the projection system and the substrate and/or support with an immersion liquid, a cleaning liquid supply system configured to provide a cleaning liquid to a part of the lithographic apparatus, and a switch constructed and arranged to direct the immersion liquid through a liquid purification system and to direct the cleaning liquid to by-pass at least a portion of the liquid purification system. Optionally, the portion of the purification system comprises a heat exchanger. Optionally, the portion of the purification system comprises a particle filter.

In a ninth aspect, there is provided an immersion type lithographic apparatus comprising a support constructed and arranged to support a substrate, a projection system constructed and arranged to project a patterned beam of radiation onto a target portion of the substrate, an immersion system configured to at least partially fill a space between the projection system and the substrate and/or support with an immersion liquid, a cleaning liquid supply system configured to provide a cleaning liquid to a part of the lithographic apparatus via a first conduit, and a switch constructed and arranged to direct the immersion liquid directly to a liquid purification system via a second conduit that is separate from the first conduit and to direct the immersion liquid through the cleaning liquid supply system.

In a tenth aspect, there is provided a method of cleaning an immersion type lithographic apparatus, the method comprising sensing contamination within the immersion type lithographic apparatus, providing a cleaner from a cleaning system to the immersion type lithographic apparatus, bypassing at least a portion of a liquid purification system within the lithographic apparatus with the cleaner, and cleaning a part of the immersion type lithographic apparatus with the cleaner. Optionally, bypassing comprises bypassing a heat exchanger. Optionally, the bypassing comprises bypassing a particle filter.

In accordance with embodiments of the invention, there is provided an immersion type lithographic apparatus that includes an indicator. The indicator may include at least one selected from the group consisting of: i) an exposure counter configured to count a number of substrates exposed since a previous cleaning action; ii) a timer configured to time the duration since a previous cleaning action; iii) a particle counter configured to count a number of contaminant particles that have exited the immersion system over a certain amount of time; and iv) a sensor configured to sense a certain level of contamination in the lithographic apparatus.

In accordance with an embodiment of the invention, there is provided an immersion type lithographic apparatus that includes an immersion system that is configured to at least partially fill an immersion space with an immersion liquid. A drain is connected to an immersion liquid recycle system that is configured to purify the immersion liquid for reuse in the immersion system.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 248, 193, 157 or 126 nm).

The term "lens", where the context allows, may refer to any one or combination of various types of optical components, including refractive and reflective optical components.

While specific embodiments of the invention have been described above, it will be appreciated that the invention may be practiced otherwise than as described. For example, the embodiments of the invention may take the form of a computer program containing one or more sequences of machine-readable instructions describing a method as disclosed above, or a data storage medium (e.g. semiconductor memory, magnetic or optical disk) having such a computer program stored therein. Further, the machine readable instruction may be embodied in two or more computer programs. The two or more computer programs may be stored on one or more different memories and/or data storage media.

The controllers described above may have any suitable configuration for receiving, processing, and sending signals. For example, each controller may include one or more processors for executing the computer programs that include machine-readable instructions for the methods described above. The controllers may also include data storage medium for storing such computer programs, and/or hardware to receive such medium.

One or more embodiments of the invention may be applied to any immersion lithography apparatus, in particular, but not exclusively, those types mentioned above and whether the immersion liquid is provided in the form of a bath or only on a localized surface area of the substrate, or is unconfined. In an unconfined arrangement, the immersion liquid may flow over the surface of the substrate and/or substrate table so that substantially the entire uncovered surface of the substrate table and/or substrate is wetted. In such an unconfined immersion system, the liquid supply system may not confine the immersion liquid or it may provide a proportion of immersion liquid confinement, but not substantially complete confinement of the immersion liquid.

An immersion system as contemplated herein should be broadly construed. In certain embodiments, it may be a mechanism or combination of structures that provides a liquid to a space between the projection system and the substrate and/or substrate table. It may comprise a combination of one or more structures, one or more liquid inlets, one or more gas inlets, one or more gas outlets, and/or one or more liquid outlets that provide liquid to the space. In an embodiment, a surface of the space may be a portion of the substrate and/or substrate table, or a surface of the space may completely cover a surface of the substrate and/or substrate table, or the space may envelop the substrate and/or substrate table. The immersion system may optionally further include one or more elements to control the position, quantity, quality, shape, flow rate or any other feature of the liquid. The one or more controlling elements can be provided to control the apparatus. The controller may have a processor which may operate to execute the one or more computer programs.

The immersion liquid used in the apparatus may have different compositions, according to the desired properties and the wavelength of exposure radiation used. For an exposure wavelength of 193 nm, ultra pure water or water-based compositions may be used and for this reason the immersion liquid is sometimes referred to as water and water-related terms such as hydrophilic, hydrophobic, humidity, etc. may be used, although they should be considered more generically. It is intended that such terms should also extend to other high refractive index liquids which may be used, such as fluorine containing hydrocarbons.

The descriptions above are intended to be illustrative, not limiting. Thus, it will be apparent to one skilled in the art that modifications may be made to the invention as described without departing from the scope of the claims set out below.

What is claimed is:

1. An immersion type lithographic system, comprising:
   an immersion type lithographic apparatus, comprising:
      a support constructed and arranged to support a substrate,
      a projection system constructed and arranged to project a patterned beam of radiation onto a target portion of the substrate, and a liquid confinement structure configured to at least partially fill a space between the projection system and the substrate and/or support with an immersion liquid;

a liquid supply system constructed and arranged to supply the immersion liquid to the liquid confinement structure; and a cleaning system constructed and arranged to supply a cleaning liquid comprising a cleaner to a part of the liquid confinement structure to clean the part of the liquid confinement structure, the cleaning system further comprising an outlet system configured and arranged to receive a used cleaning liquid and the cleaning system further configured to select a cleaning mode from a plurality of cleaning modes and provide the cleaner from a plurality of different cleaners to the part of the liquid confinement structure based on the selected cleaning mode.

2. The immersion type lithographic system according to claim 1, wherein the liquid confinement structure is configured such that the cleaning liquid passes through the liquid confinement structure.

3. The immersion type lithographic system according to claim 1, wherein the part is a bottom surface of the liquid confinement structure.

4. The immersion type lithographic system according to claim 1, wherein the part is a micro sieve provided in the bottom surface.

5. The immersion type lithographic system according to claim 1, wherein the cleaning system is constructed and arranged to supply ultra-pure water to the part of the liquid confinement structure to rinse the part of the liquid confinement structure after cleaning the part of the liquid confinement structure.

6. The immersion type lithographic system according to claim 1, wherein the outlet system comprises a separator configured to separate liquid and gas phases included in the used cleaning liquid.

7. The immersion type lithographic system according to claim 6, wherein the outlet system comprises a degasser to remove the gas from the cleaning liquid, the outlet system further comprising a drain configured to receive a liquid exiting the degasser.

8. The immersion type lithographic system according to claim 7, further comprising a recycle system and a drain switch to direct the liquid exiting the degasser to the recycle system or to a waste drain for removal.

9. The immersion type lithographic system according to claim 8, wherein the recycle system is configured to purify the liquid for reuse as immersion liquid by the liquid supply system.

10. The immersion type lithographic system according to claim 1, wherein the lithographic apparatus further comprises an indicator configured to indicate whether the part of the lithographic apparatus should be cleaned.

11. The immersion type lithographic system according to claim 10, wherein the indicator comprises at least one selected from the group consisting of: i) an exposure counter configured to count a number of substrates exposed since a previous cleaning action; ii) a timer configured to time the duration since a previous cleaning action; iii) a particle counter configured to count a number of contaminant particles that have exited the immersion system over a certain amount of time; and iv) a sensor configured to sense a certain level of contamination in the lithographic apparatus.

12. The immersion type lithographic system according to claim 1, wherein the cleaner comprises an alkali fluid.

13. The immersion type lithographic system according to claim 1, the cleaning system being in fluid communication with the liquid supply system and the liquid confinement structure.

14. A method of cleaning an immersion type lithographic apparatus, the method comprising:

receiving an indication that a part of a liquid confinement structure of the immersion type lithographic apparatus should be cleaned;

selecting a cleaning mode from among a plurality of different cleaning modes based on the indication;

providing a cleaning liquid comprising a cleaner selected based on the cleaning mode, from a cleaning system to the part of the liquid confinement structure of the immersion type lithographic apparatus to clean the part of the liquid confinement structure; and providing a rinsing liquid to the part of the immersion type lithographic apparatus to rinse the part.

15. The method according to claim 14, wherein the rinsing liquid comprises ultra-pure water.

16. The method according to claim 14, wherein the cleaner comprises at least one selected from the group consisting of: ozone, an alkaline, a soap, and an acid.

17. The method according to claim 14, wherein the cleaning system is located in an in-line cleaning cabinet, the in-line cleaning cabinet being in fluid communication with the immersion type lithographic apparatus.

18. The method according to claim 14, further comprising providing a used cleaning liquid, the used cleaning liquid being the cleaning liquid provided to clean the part, to an outlet system.

19. The method according to claim 18, further comprising removing ozone from the used cleaning liquid using a degasser of the outlet system.

20. The method according to claim 19, further comprising directing a liquid exiting the degasser to a recycle system for reuse in the lithographic apparatus or to a waste drain for removal.

21. An immersion type lithographic system, comprising:

a support constructed and arranged to support a substrate;

a projection system constructed and arranged to project a patterned beam of radiation onto a target portion of the substrate; and a liquid confinement structure configured to at least partially fill a space between the projection system and the substrate and/or support with an immersion liquid;

a liquid supply system constructed and arranged to supply the immersion liquid to the liquid confinement structure;

an indicator configured to provide a signal to indicate whether a part of the lithographic apparatus should be cleaned; and a cleaning system constructed and arranged to supply a cleaning liquid comprising a cleaner to a part of the liquid confinement structure to clean the part of the liquid confinement structure, the cleaning system further constructed and arranged to select among a plurality of different cleaning modes using the cleaning liquid based on the signal.

22. The immersion type lithographic system according to claim 21, wherein the cleaning system is constructed and arranged to provide the cleaner from a plurality of different cleaners to the part of the liquid confinement structure based on the selected cleaning mode.

* * * * *